United States Patent
Stoddard et al.

(10) Patent No.: US 7,758,696 B2
(45) Date of Patent: Jul. 20, 2010

(54) METHODS AND SYSTEMS FOR MONITORING A SOLID-LIQUID INTERFACE

(75) Inventors: Nathan G. Stoddard, Gettysburg, PA (US); Roger F. Clark, Frederick, MD (US); Tim Kary, Union Bridge, MD (US)

(73) Assignee: BP Corporation North America Inc, Warrenville, IL (US)

( * ) Notice: Subject to any disclaimer, the term of this patent is extended or adjusted under 35 U.S.C. 154(b) by 2 days.

(21) Appl. No.: 12/233,694

(22) Filed: Sep. 19, 2008

(65) Prior Publication Data
US 2009/0116019 A1    May 7, 2009

Related U.S. Application Data

(60) Provisional application No. 60/975,603, filed on Sep. 27, 2007.

(51) Int. Cl.
*C30B 13/00* (2006.01)
(52) U.S. Cl. .............. 117/52; 117/14; 117/201; 250/559.27; 250/573; 250/577; 356/43; 356/445; 356/630; 210/513
(58) Field of Classification Search ........... 356/43, 356/445, 630; 250/559.27, 559.42, 573, 250/574, 577; 117/14, 201, 513
See application file for complete search history.

(56) References Cited

U.S. PATENT DOCUMENTS

| | | | |
|---|---|---|---|
| 3,740,563 A | 6/1973 | Reichard | 250/222 |
| 4,508,970 A * | 4/1985 | Ackerman | 250/577 |
| 5,846,318 A * | 12/1998 | Javidi | 117/14 |
| 2007/0169684 A1 | 7/2007 | Stoddard | |
| 2007/0169685 A1 | 7/2007 | Stoddard | |

FOREIGN PATENT DOCUMENTS

| JP | 09/202689 | 8/1997 |
|---|---|---|
| JP | 10/072278 | 3/1998 |

OTHER PUBLICATIONS

R.L. Parker and J.R. Manning, "Application of Pulse-Echo Ultrasonics to Locate the Solid/Liquid Interface During Solidification and Melting," Journal of Crystal Growth 17 (1986) 341-353.

(Continued)

*Primary Examiner*—Gregory J Toatley, Jr.
*Assistant Examiner*—Iyabo S Alli
(74) *Attorney, Agent, or Firm*—John P. Poliak; Thomas E. Nemo

(57) ABSTRACT

Methods and systems are provided for monitoring a solid-liquid interface, including providing a vessel configured to contain an at least partially melted material; detecting radiation reflected from a surface of a liquid portion of the at least partially melted material that is parallel with the liquid surface; measuring a disturbance on the surface; calculating at least one frequency associated with the disturbance; and determining a thickness of the liquid portion based on the at least one frequency, wherein the thickness is calculated based on $$L = \frac{f^2 w^2}{g},$$

where g is the gravitational constant, w is the horizontal width of the liquid, and f is the at least one frequency.

14 Claims, 10 Drawing Sheets

OTHER PUBLICATIONS

C-K Jen et al. "Ultrasonic Evaluation of Semi-Solid Metals During Processing," Meas. Sci. Technol. 11 (2000) 1570-1575.

Zhixin Li et al. "A Theoretical Analysis of the Laser Melt-Level Monitoring System for the Czochralski Crystal Growing Furnaces," IEEE Trans. On Instrumentation and Measurement, vol. 46, n.3 (Jun. 1997).

Queheillalt et al. "Laser Ultrasonic Sensing of the Melting and Solidification of Cadmium Telluride," Journal of Crystal Growth 225 (2001) 34-44.

A. Eyer, F. Haas, et al., Localization of the Solid/Liquid Interface During Directional Solidification of Silicone by a Pulse-Echo Ultrasonic Technique, XP-001135686, Apr. 8, 1991, 3 pages.

* cited by examiner

METHODS AND SYSTEMS FOR MONITORING A SOLID-LIQUID INTERFACE

RELATED APPLICATIONS

This application claims the benefit of priority from U.S. Provisional Application No. 60/975,603, filed Sep. 27, 2007, which is expressly incorporated herein by reference in its entirety.

This invention was made with U.S. Government support under National Renewable Energy Laboratory (NREL) Subcontract No. ZDO-2-30628-03 under Department of Energy (DOE) Contract No. DE-AC36-98GO10337, awarded by DOE. The U.S. Government has certain rights in this invention.

TECHNICAL FIELD

The present invention generally relates to methods and systems for monitoring a solid-liquid interface or more generally the depth of a liquid. The invention further relates to methods and systems for monitoring the progress of melting and/or solidification of a solid material by monitoring movement of a solid-liquid interface in a partially melted material during, for example, the melt and solidification cycles of a casting process.

BACKGROUND INFORMATION

Recent advances have been made in casting of materials, such as silicon, for applications in the photovoltaic industry. Such advances are described, for example, in copending application Ser. Nos. 11/624,365 and 11/624,411, filed Jan. 18, 2007. Materials, such as those used to form semiconducting substrates or wafers, may include combinations of elements from Groups II-VI, III-V, and IV-IV. As used herein, the term "material," unless otherwise specified, includes any element or combination of elements from Groups II-VI, III-V, and IV-IV, in particular those which may be formed into semiconductor wafers or substrates.

During casting processes, for example, the material may exist simultaneously in multiple phases, such as a molten or partially melted material containing a liquid portion and a solid portion. A solid-liquid interface is located between the liquid and solid portions until the material is completely solidified. As used herein, the term "solid-liquid interface" refers to a region bordering both the liquid and solid portions of a material, for example, during either the melting or solidification portions of a casting process. It is understood that the solid-liquid interface may not be exactly two-dimensional, and may have a finite thickness depending on the material being melted/solidified and other processing conditions. Monitoring the solid-liquid interface is important to controlling the melting and solidification processes during casting, so that certain crystal growth characteristics may be achieved, for example. In another example, monitoring the depth of a liquid being held in a container, such as a crucible or holding tank, is important where the height of the column of liquid cannot be determined by only knowing the position of the free liquid surface.

In a known casting procedure for the manufacture of photovoltaic cells, a material, such as silicon feedstock, may be mixed with a dopant for inducing either a positive or negative conductivity type, melted, and then crystallized by either pulling the crystallized material out of a melt zone or solidifying it in place to form ingots. If silicon feedstock is used, these ingots may be monocrystalline silicon (via the Czochralski (CZ) or float zone (FZ) methods), or cast into blocks or "bricks" of multi-crystalline silicon or polycrystalline silicon, depending on the grain size of the individual silicon grains. As used herein, the term "cast" means that the silicon is formed by cooling a molten material in a mold or vessel used to hold the molten material. As used herein, the term "monocrystalline silicon" refers to a body of single crystal silicon, having one consistent crystal orientation throughout. Further, "conventional multi-crystalline silicon" refers to crystalline silicon having cm-scale grain size distribution, with multiple randomly oriented crystals located within a body of silicon. As used herein, however, the term "geometrically ordered multi-crystalline silicon" (hereinafter abbreviated as "geometric multi-crystalline silicon") refers to crystalline silicon, having a geometrically ordered cm-scale grain size distribution, with multiple ordered crystals located within a body of silicon. Further, as used herein, the term "poly-crystalline silicon" refers to crystalline silicon with micron order grain size and multiple grain orientations located within a given body of silicon. For example, the grains are typically an average of about submicron to submillimeter in size (e.g., individual grains may not be visible to the naked eye), and grain orientation distributed randomly throughout. In the casting procedure described above, the ingots or blocks are cut first into bricks with the proper cross-section, and then into thin substrates, also referred to as wafers, by known slicing or sawing methods. These wafers may then be processed into photovoltaic cells.

Conventional monocrystalline silicon for use in the manufacture of photovoltaic cells is generally produced by the CZ or FZ methods, both being processes in which a cylindrically shaped boule of crystalline silicon is produced. For a CZ process, the boule is slowly pulled out of a pool of molten silicon. For a FZ process, solid material is fed through a melting zone and re-solidified on the other side of the melting zone. A boule of monocrystalline silicon, manufactured in these ways, contains a radial distribution of impurities and defects, such as rings of oxygen-induced stacking faults (OSF) and "swirl" defects of interstitial or vacancy clusters. Even with the presence of these impurities and defects, monocrystalline silicon is generally a preferred source of silicon for producing photovoltaic cells, because it can be used to produce high efficiency solar cells. Monocrystalline silicon is, however, more expensive to produce than conventional multi-crystalline silicon, using known techniques such as those described above.

Conventional multi-crystalline silicon for use in the manufacture of photovoltaic cells is generally produced by a casting process. Casting processes for preparing conventional multi-crystalline silicon are known in the art of photovoltaic technology. Briefly, in such processes, molten silicon is contained in a crucible, such as a quartz crucible, and is cooled in a controlled manner to permit the crystallization of the silicon contained therein. The block of multi-crystalline silicon that results is generally cut into bricks having a cross-section that is the same as or close to the size of the wafer to be used for manufacturing a photovoltaic cell, and the bricks are sawn or otherwise cut into such wafers. The multi-crystalline silicon produced in such manner is an agglomeration of crystal grains where, within the wafers made therefrom, the orientation of the grains relative to one another is effectively random. Photovoltaic cells made from multi-crystalline silicon generally have lower efficiency compared to equivalent photovoltaic cells made from monocrystalline silicon, due to a higher concentration of grain boundary and dislocation defects. However, because of the relative simplicity and lower costs for manufacturing conventional multi-crystalline silicon, as well as effective defect passivation in cell processing, multi-crystalline silicon is a more widely used form of silicon for manufacturing photovoltaic cells.

Recently, high quality geometrically ordered multi-crystalline silicon has been produced by a casting process, yielding large volumes of cast geometrically ordered multi-crystalline silicon that does not have a random distribution of grains therein. Additionally, high quality monocrystalline silicon has also been produced by a casting process, yielding large volumes of cast monocrystalline silicon that is free of both the high levels of dislocations and grain boundaries found in multicrystalline cast silicon and the radial distribution of defects and impurities present in the CZ and FZ methods. See, for example, copending U.S. patent application Ser. Nos. 11/624,365 and 11/624,411.

The inventors have invented improved systems and methods for monitoring a solid-liquid interface during, for example, a casting process. The inventors have also invented non-invasive and non-contact systems and methods for monitoring a solid-liquid interface during, for example, a casting process.

SUMMARY OF THE INVENTION

In accordance with the methods and systems described above, there is provided a method of monitoring a solid-liquid interface, comprising: providing a vessel configured to contain an at least partially melted material; detecting radiation reflected from a surface of a liquid portion of the at least partially melted material that is parallel with the liquid surface; measuring a disturbance on the surface; calculating at least one frequency associated with the disturbance; and determining a thickness of the liquid portion based on the at least one frequency, wherein the thickness is calculated based on $$L = \frac{f^2 w^2}{g},$$

where g is the gravitational constant, w is the horizontal width of the liquid, and f is the at least one frequency.

In accordance with the methods and systems described above, there is also provided a method of monitoring a solid-liquid interface, comprising: providing a vessel configured to contain an at least partially melted material, the at least partially melted material being at least partially reflective; detecting radiation reflected from a surface of a liquid portion of the at least partially melted material that is parallel with the liquid surface; measuring a size of a reflection of an object from a viewpoint above the surface; calculating a distance to the surface from the viewpoint; and calculating a thickness of the liquid based on the distance.

In accordance with the methods and systems described above, there is also provided a system for monitoring a solid-liquid interface, comprising: a vessel configured to contain an at least partially melted material; a window in the vessel for detecting reflected radiation from a liquid portion of the at least partially melted material; a means for generating a disturbance on the surface of the liquid portion; a means for detecting a change in the radiation reflected from the disturbance; a means for calculating a frequency associated with the disturbance based on the detected radiation; and a means for determining a thickness of the liquid portion based on the frequency.

Additional features and advantages of the invention will be set forth in the description that follows, being apparent from the description or learned by practice of embodiments of the invention. It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention. In the drawings.

DESCRIPTION OF THE EMBODIMENTS

Figure 1A:
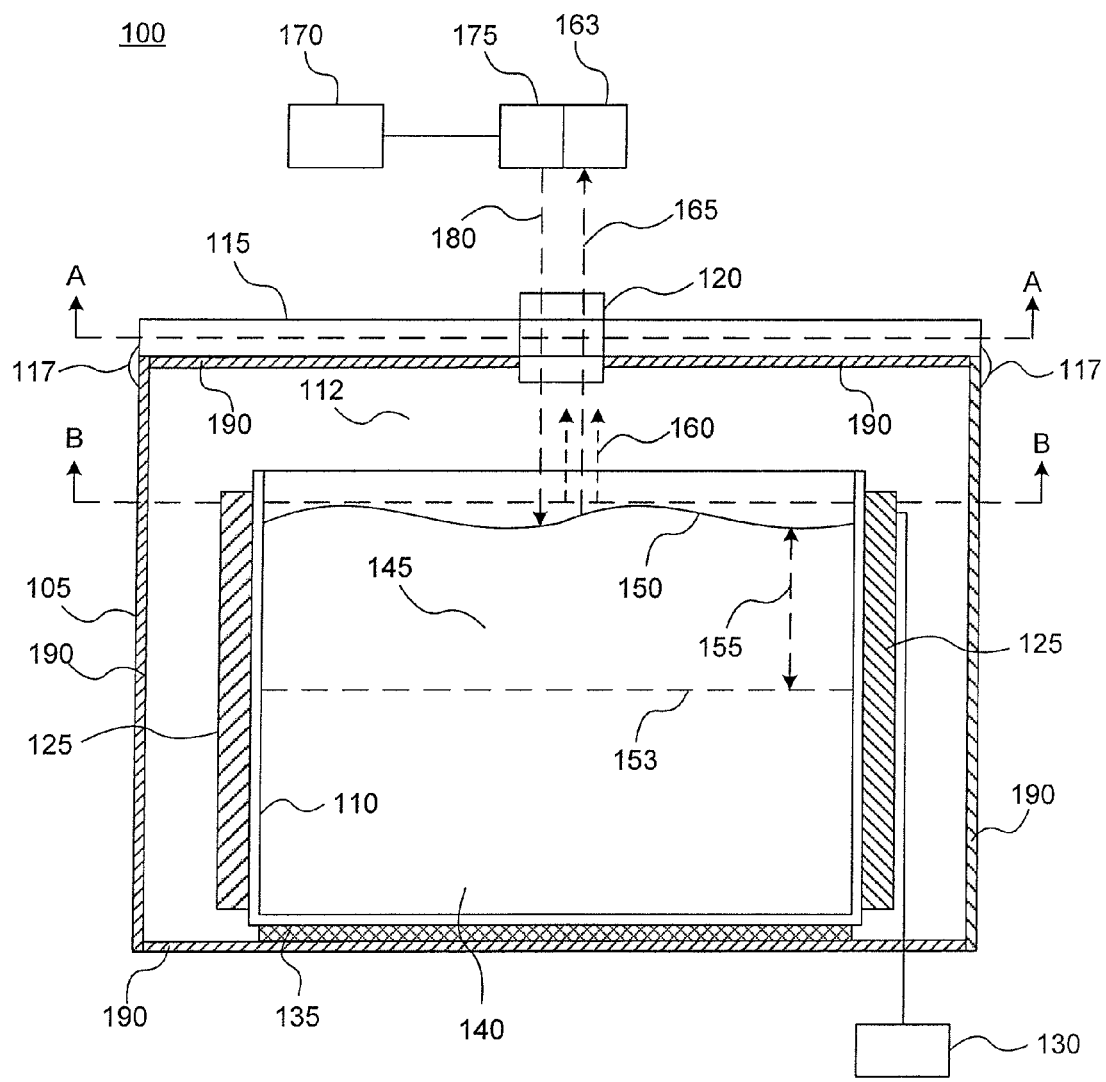
FIG. 1A illustrates, in cross-section, an exemplary casting station and apparatus for monitoring a solid-liquid interface in a partially-melted material, according to an embodiment of the present invention.

Reference will now be made in detail to embodiments of the present invention, examples of which are illustrated in the accompanying drawings. Wherever possible, the same or similar reference numbers will be used throughout the drawings to refer to the same or like parts.

In embodiments consistent with the invention, the crystallization of a molten material, such as silicon, is conducted by a casting process. The casting process may be implemented in different ways, including using one or more seed crystals. As disclosed herein, such a casting process may be provided so that the size, shape, and orientation of crystal grains in the cast body of crystallized material is controlled. In general, the casting process requires accurate monitoring of the solid-liquid interface and its movement during casting in order to accurately control solidification and to ensure a final product that is substantially free of, or is free of, defects. By way of example, solidification of a material during a casting process can take place in a crucible, where solidification is initiated from at least one wall of the crucible, and not through a cooled foreign object drawing silicon out of the crucible. The crucible may have any suitable shape, such as a cup, a cylinder, or a box. Further, consistent with an embodiment of the present invention, the mold, vessel, or crucible includes at least one "hot side wall" surface in contact with the molten material. As used herein, the term "hot side wall" refers to a surface that is isothermal with or hotter than the molten material that it contacts. Preferably, a hot side wall surface remains fixed during processing of the material.

Consistent with one embodiment of the present invention, solidification during a casting process can be accomplished by positioning a desired collection of crystalline "seeds" in, for example, the bottom of a vessel, such as a quartz, fused silica, or graphite crucible that can hold a molten material. As used herein, the term "seed" refers to a geometrically shaped piece of material with a desired crystal structure, wherein at least one cross-section has a geometric, polygonal, shape, preferably having a side that conforms to a surface of a vessel in which it may be placed. For example, in a casting process for silicon, such a seed can be either a monocrystalline piece of silicon or a piece of geometrically ordered multi-crystalline silicon. As used herein, the term "continuous monocrystalline silicon" refers to single crystal silicon, where the body of silicon is one homogeneous body of silicon with a consistent crystal orientation throughout and not smaller pieces of silicon joined together to form a larger piece of silicon. Further, as used herein, the term "continuous geometric multi-crystalline silicon" refers to geometric multi-crystalline silicon where the body of silicon is one homogeneous body of geometric multi-crystalline silicon and not smaller pieces of silicon joined together to form a larger piece of silicon. Consistent with an embodiment of the present invention, a seed may have a top surface that is parallel to its bottom surface, although this does not have to be the case.

During a casting process of silicon, for example, molten silicon is allowed to cool and crystallize in the presence of the seeds, preferably in a manner such that the cooling of the molten silicon is conducted so that the crystallization of the molten silicon starts at or below the level of the original top of the solid seeds and proceeds away, preferably upwards away, from the seeds. The solid-liquid interface at an edge of the molten silicon conforms to a cooling surface of the vessel, such as a surface in a crucible, in which it is being cast. According to embodiments of the invention, the solid-liquid interface between the molten silicon and the crystallized silicon can be maintained substantially flat throughout part or all of the casting process. In an embodiment of the invention, the solid-liquid interface at each of the edges of the molten silicon is controlled during the cooling so as to move in a direction that increases a distance between the molten silicon and the silicon seed crystal while preferably maintaining a substantially flat solid-liquid interface. Although this example described casting of silicon, one of ordinary skill in the art will recognize that other materials may be cast using the method discussed above.

Therefore, consistent with the present invention, the solid-liquid interface may conform to the shape of a cooled surface of the vessel. For example, with a flat-bottomed crucible, the solid-liquid interface may remain substantially flat, with the solid-liquid interface having a controlled profile. The solid-liquid interface can be controlled so that its radius of curvature decreases as one moves from the edge to the center. Alternatively, the solid-liquid interface can be controlled to maintain an average radius of curvature of at least half the width of the vessel. Moreover, the solid-liquid interface can be controlled to maintain an average radius of curvature of at least twice the width of the vessel. The solid can have a slightly convex interface with a radius of curvature at least about four times the width of the vessel. For example, the solid-liquid interface can have a radius of curvature generally greater than 2 m in a 0.7 m square crucible, more than twice the horizontal dimension of the crucible, and preferably about 8× to about 16× a horizontal dimension of the crucible.

Monitoring the solid-liquid interface permits controlled heating and/or cooling of a portion of the material to be crystallized in order to control the location and movement of a solid-liquid interface during the casting process. Consistent with the present invention, this monitoring may be performed by detecting changes in the surface of material being cast. For example, a form of radiation may be reflected from a liquid surface of a material to be cast, or emitted therefrom. Based on a detected amount of reflected radiation, characteristics of surface waves, bulk waves or other disturbances on the surface of the molten material may be calculated. After parameters, such as wave characteristics or disturbances, have been calculated, it is then possible to calculate a distance between the liquid surface and the solid-liquid interface, based on the total amount of material cast and surface area of the crucible in which the material is cast.

As used herein, the term "surface wave" includes any wave created by a disturbance or disturbances on the surface of molten material that propagates along the surface, involving mass transport of the liquid. For example, surface waves may be standing waves having characteristic resonance frequencies or they may have any periodicity depending on intrinsic or environmental factors. Furthermore, as used herein, "radiation," "reflected radiation," and "emitted radiation" refer to any type of radiation which will reflect, partially reflect, or otherwise be emitted from, the surface of a partially melted or molten material.

Figure 1B:
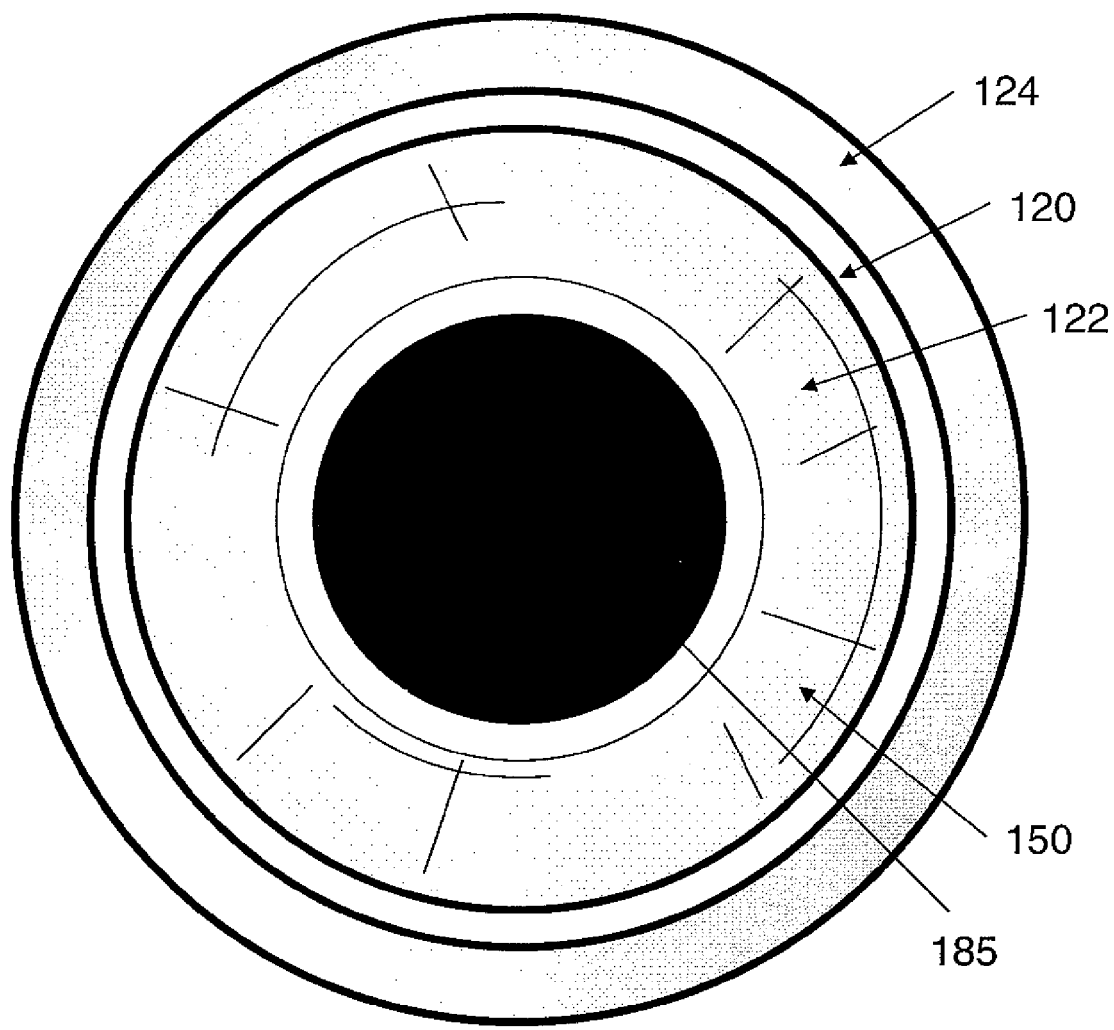
FIG. 1B illustrates a partial plan view taken along the line A-A in FIG. 1A, according to an embodiment of the present invention.

Referring to FIG. 1A, an exemplary casting station 100 is shown in cross-section. Casting station 100 includes a vessel 105 containing, in part, a crucible 110. Crucible 110 may be of any suitable shape, such as flat-bottomed or cup-shaped, though it is depicted for illustration purposes as rectangular-shaped. Crucible 110 is open on at least one side, the open side preferably facing a removable cover 115. Removable cover 115 may be connected to the rest of vessel 105 by clasp/seal 117. A window 120 may be provided through the removable cover 115 for viewing the contents of crucible 110, and a tube (not shown) may funnel process gas down into hot zone 112, enclosed by insulation 190. An example of window 120 is shown in cross-section in FIG. 1A, and a partial plan view through the window taken along the line A-A is shown in FIG. 1B. In FIG. 1B, tube 122 is illustrated comprising part of the viewing path through window 120. Also as shown in FIG. 1B, window 120 may also include an outer port 124.

Still referring to FIG. 1A, heating elements 125 are included in vessel 105, preferably surrounding one or more sides of crucible 110. Heating elements 125 may be resistive heating elements, for example, and may surround crucible 110 or may be positioned over top and under the bottom of the crucible. Alternatively, heating elements 125 may be individual heating elements of any desired size, shape, or quantity sufficient to heat the contents of crucible 110. Preferably, heating elements 125 may be a series of concentric rings or individual bars/strips/blocks, such that each of the elements 125 may be controlled independently to enable localized heating of a specific portion of crucible 110. Heating elements 125 may be, for example, a resistive heating element or elements, such as graphite or silicon carbide, electromagnetic (EM) heating coils, or any other suitable heating apparatus. Heating elements 125 are preferably controlled, electronically or otherwise, by a controller 130. For example, controller 130 may be a programmable electronic device, either self-contained or part of an overall computer control system, for providing electric current to heating elements 125.

Still referring to FIG. 1A, a solid heat sink material 135 is in contact with a bottom of crucible 110 for radiating heat to water-cooled walls (not shown). For example, heat sink material 135 can be a solid block of graphite, and can preferably have dimensions as large or larger than the bottom of the crucible. Consistent with an exemplary embodiment of the invention, heat sink material 135 can be approximately 66 cm by 66 cm by 20 cm, when used with a crucible having a bottom surface that is 66 cm by 66 cm. The side walls of crucible 110 are, preferably, water cooled and insulated from hot zone 112, provided that solidification of any material melted therein begins at the bottom of the crucible 110. Alternatively, it is possible to have heat sink material 135 located on one or more other surfaces of crucible 110, in combination with alternatively placed heating elements 125. Consistent with certain embodiments of the invention, heating elements 125 may alternatively be located at different positions with respect to the bottom of crucible 110. Further, by selectively controlling heating elements 125, controller 130 may be used to produce a temperature gradient (not shown) inside crucible 110. Using a combination of heating elements 125 and controller 130, and optionally using heat sink 135, any desired temperature gradient may be produced in crucible 110.

As further illustrated in FIG. 1A, a solid material 140 is added to crucible 110. Solid material 140 may be, for example, any suitable solid material for use in a casting process. For example, if silicon is being cast, solid material 140 may comprise silicon feedstock. In embodiments consistent with the invention, such feedstock, for example, may be placed on top of one or more seed crystals, such as a monocrystalline piece or silicon or a piece of geometrically ordered multi-crystalline silicon. Moreover, depending on the casting process, solid material 140 may completely or partially fill crucible 110. When controller 130 controls the heating of one or more of heating elements 125, part or all of the solid material 140 can be melted.

In the example illustrated in FIG. 1A, melting may begin near the top of crucible 110, producing a region of liquid material 145 inside crucible 110. Liquid material 145 has a liquid surface 150, and a solid-liquid interface 153 with the remaining portion of solid material 140. Liquid surface 150 may experience one or more surface waves or disturbances. The thickness of the liquid material 145 is depicted in FIG. 1A by the distance 155 between liquid surface 150 and solid-liquid interface 153. Alternatively, melting may begin at the bottom of crucible 110, or at any point in between, depending on the desired temperature gradient produced within crucible 110 by heating elements 125. Consistent with embodiments of the invention, liquid material 145 may be above the solid material 140. It may also be possible, however, depending on the material being cast, to have at least a portion of solid material 140 float in or on liquid material 145.

The melting phase of solid material 140 may be closely monitored to track the position of the solid-liquid interface 153. Preferably, the melting phase proceeds until all or almost all of the solid material 140 is completely melted. For example, the heating can be closely controlled such that all of the solid material 140 does not melt completely, by maintaining a $\Delta T$ of about 0.1° C./min or less, as measured on an outside surface of the crucible 110, after reaching the melting temperature of the solid material 140 elsewhere in the crucible 110. Preferably, in one embodiment, the heating can be closely controlled by maintaining a $\Delta T$ of about 0.05° C./min or less, as measured on an outside surface of the crucible 110, after reaching the melting temperature of solid material 140 elsewhere in the crucible. For example, consistent with the invention, the $\Delta T$ can be measured on an outside surface of the crucible 110 between the crucible and heat sink 135.

Still referring to FIG. 1A, by optically probing liquid surface 150, it is possible to gather information on the progress of melting/crystal growth and the thickness of the liquid material 145, as depicted by distance 155, in crucible 110. Thus, monitoring the thickness of liquid material 145 also provides information on the location and movement of solid-liquid interface 153. This permits controlled cooling of liquid material 145 during casting, in order to control the location and movement of solid-liquid interface 153 during the casting process.

For example, if casting station 100 is being used to cast silicon, there will be a substantial amount of light emitted from the open side of crucible 110 due to the radiating heat from the molten silicon and the heat emitted by the hot insulation and reflected by the liquid silicon. Many molten materials, such as molten silicon, are reflective liquids. Optically visible native radiation is depicted by arrows 160 in FIG. 1A. Consistent with certain embodiments of the present invention, monitoring of the solid-liquid interface 153 may be performed by detecting changes in liquid surface 150 of the material being cast. For example, a form of radiation, such as optically visible native radiation 160, may be emitted from liquid surface 150. Based on an amount of radiation 160 detected at detector 163, as shown in FIG. 1A, characteristics of any disturbances on liquid surface 150 may be calculated. Such a detector may be a pyrometer or a charge couple device array, capable of measuring light intensity and/or color as a function of time. After characterizing any disturbances on liquid surface 150, it is then possible to calculate a distance 155 between the liquid surface 150 and the solid-liquid interface 153, when the total amount of material cast and surface area of the crucible 110 in which the material is cast are known.

Thus, optically visible native radiation 160 may be viewed through window 120 at the top of vessel 105. Consistent with the present invention, window 120 may be optically dark in comparison to the optically visible native radiation 160, due to its dramatically lower temperature and associated lack of visible black-body radiation. Thus, when viewing liquid surface 150 through window 120, a dark spot 185 may be visible on the liquid surface 150. An example of dark spot 185 is illustrated in plan-view in FIG. 1B, taken along the lien A-A in FIG. 1A. Dark spot 185 is actually a reflection of the optically dark window 120 on the comparatively bright liquid surface 150. Due to the contrast between dark spot 185 and surface disturbances in liquid surface 150 during casting, disturbances present on the surface 150 and encompassed by dark spot 185 can be detected. As radiation, such as optically visible native radiation 160, passes through window 120, its intensity will vary depending on the presence and intensity of surface waves or disturbances which appear on the portion of liquid surface 150 that is encompassed by dark spot 185. Thus, for example, optically visible native radiation 160 may be observed and its intensity may be detected by detector 163. Detector 163 may be, for example, an optical pyrometer, charge-coupled device (CCD), photocell, photodiode, or almost any other suitable fast-response light detector, including infrared-based light detectors.

Either transmitted or reflected radiation may pass through window 120. Referring to FIG. 1A, for example, radiation could also consist of reflected radiation 165 observed through window 120 after it reflects from liquid surface 150. Reflected radiation 165 could be generated, for example, by light passing into the chamber through window 120 and reflecting off of liquid surface 150. Alternatively, reflected radiation 165 could originate at an emitter 175, propagate through window 120 as transmitted radiation 180, and then reflect off of liquid surface 150. For example, transmitted radiation 180 may be laser light generated at emitter 175. Emitter 175 may be, for example, a laser, light-emitting diode (LED) source, or other radio- or micro-wave source. It will be understood that radiation 180 may also be any other suitable type of electromagnetic radiation, including visible light.

As shown in FIG. 1A, reflected radiation 180 or optically visible native radiation 160, or a combination thereof, can be detected by detector 163. A signal corresponding to the intensity of the reflected radiation 180 detected by detector 163 is then passed to a calculation and storage device 170, such as a processor or computer. Calculation and storage device 170 may be any means or apparatus known in the art which would allow collection, storage, and analysis of data. For example, a computer with appropriate data capture, analysis logic or software, and data transfer devices may be used. Other appropriate apparatuses for use as calculation and storage device 170 will be apparent to one of ordinary skill in the art. In certain embodiments consistent with the invention, a laser vibrometer may be used to emit a laser beam and detect interference between the emitted beam and the reflected energy. The interference signal of the laser may be converted to a voltage containing all of the signal information. This voltage signal may then be converted to a digital signal for computer processing or plugged directly into an oscilloscope. On a computer, for example, further real-time or post-processing data analysis may decompose the signal into its constituent frequencies.

In one embodiment, transmitted radiation 180 is transmitted via emitter 175 through window 120. Emitter 175 may transmit, for example, a laser, as transmitted radiation 180, and detector 163 detects reflected radiation 165 which comprises a reflected portion of the transmitted radiation 180. Alternatively, emitter 175 may produce sonic waves through a speaker, or other sonic wave producing device, or it may be a laser that produces sonic shock waves when the beam is coupled into the target material. In other embodiments, no emitter is required and either reflected ambient light, native radiation 160, or a combination thereof, comprises the radiation detected by detector 163.

Figure 1C:
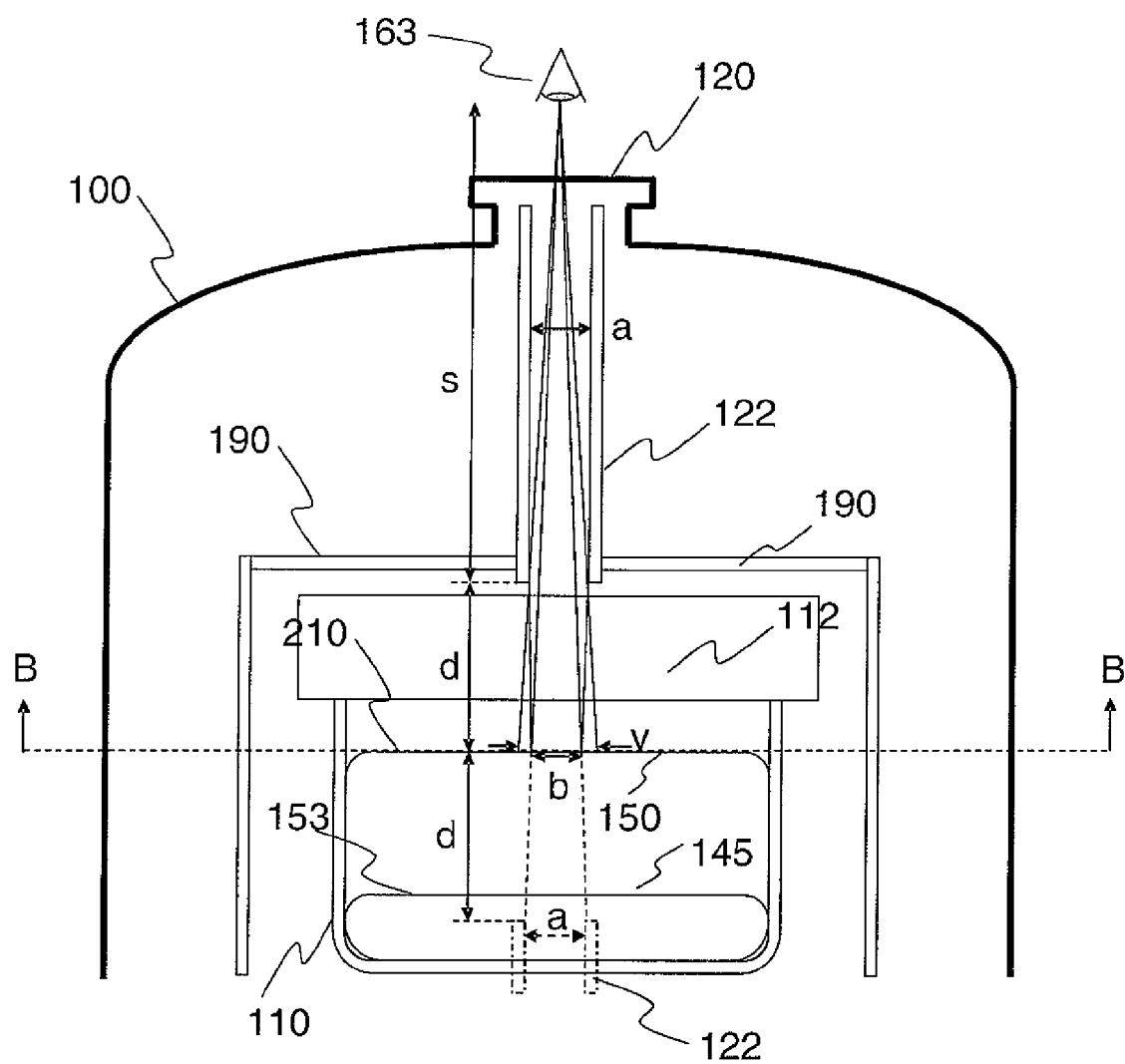
FIG. 1C illustrates, in cross-section, an exemplary casting station and apparatus for monitoring a solid-liquid interface in a partially-melted material, according to an embodiment of the present invention.

In one embodiment, as shown in FIG. 1C, the location of solid-liquid interface 153 may be monitored, for example, in the case of casting silicon, in the following way. One unusual property of silicon is that it expands as it solidifies. Specifically, a given mass of silicon will take up 10% more volume as a solid than it will as a liquid. As a result, the progress of solidification can be tracked by measuring the change in height of the liquid level from beginning to end of a melting/solidification cycle. For example, a 265 kg mass of silicon will have a height of approximately 22 cm when fully liquid in a 69 cm$^2$×69 cm$^2$ crucible. After solidification, the height will have grown to more than 24 cm, and through the solidification process there will be a change of 1 mm in the liquid level for every 1 cm of directional solidification. Consistent with this embodiment, the change of size of a reflected object visible in the reflective liquid surface 150 is used to determine the liquid level as follows.

As shown in FIG. 1C, detector 163 is located above window 120 in casting station 100. Tube 122 extends into hot zone 112 and through insulation 190 surrounding crucible 110. Within hot zone 112, during a casting process, bright radiation is being emitted from the heated insulation 190 and, to a lesser degree, from liquid material 145. The diameter of the view, "v," of detector 163 through window 120 of liquid surface 150 is given by $$v = \frac{(s+d)a}{s},$$

where "s" is the distance from detector 163 to the end of tube 122, "a" is the diameter of tube 122, and "d" is the distance from the end of tube 122 to liquid surface 150. The viewable area on liquid surface 150 will be largely occupied by the reflection of the bottom of tube 122, as shown in FIG. 1B. An image 122' of the end of tube 122 will appear to be a distance "d" below the reflecting plane taken along the line B-B (also corresponding to the line B-B in FIG. 1A). In the case where tube 122 is maintained significantly colder than hot zone 112, it will appear as a dark region in reflection (as shown by dark spot 185 in FIG. 1B), due to the lack of emitted light.

Still referring to FIG. 1C, the ratio of the diameter "b" of the dark spot to the view area "v" can be calculated as $$\frac{b}{v} = \frac{s}{(s+2d)}.$$

Likewise, the fraction of the area taken up by dark spot 185 (shown in FIG. 1B) will be $$\xi = \frac{A(b)}{A(v)} = \frac{s^2}{(s+2d)^2},$$

and will have a dependence on the distance to liquid surface 150. In this way, the level of liquid material 145 (and therefore the height of the solid-liquid interface 153) can be determined by analyzing the size of dark spot 185 (shown in FIG. 1B and represented by "b" in FIG. 1C. For example, if the distance "s" is 1.5 m and the distance d is 0.3 m at the beginning of the solidification stage of a casting process, the ratio ξ will be 0.51. Consistent with the present invention, if a charge couple device (CCD) array is used as detector 163, then 51% of the pixels would appear dark, for example, in an image analysis of the CCD array. For a 2 megapixel CCD, there would be 1,020,408 dark pixels with the balance being bright pixels. Just prior to the end of solidification, "d" would be 0.28 m, the ratio $\xi$ would change to $\xi=0.53$, and 1,060,420 pixels would appear dark. The difference between the two examples discussed above, taken over 24 cm of solidification, nets 1,667 pixels per cm or 167 pixels per mm of growth of solid material 140. While this represents only a 0.01% change in pixels per mm of growth, as illustrated by these examples, good averaging and a high quality CCD are capable of this level of accuracy. The sensitivity only increases as the ratio of d/s increases. In this way, measurement of the apparent size of an object of known position on a reflective liquid can be used to determine the progress of solidification when the material has a known expansion or contraction upon phase change. Consistent with the present invention, this method provides the ability to measure height from a single vertical vantage point, which is a 60% improvement in sensitivity over simply measuring a linear change in height.

Figure 2A:
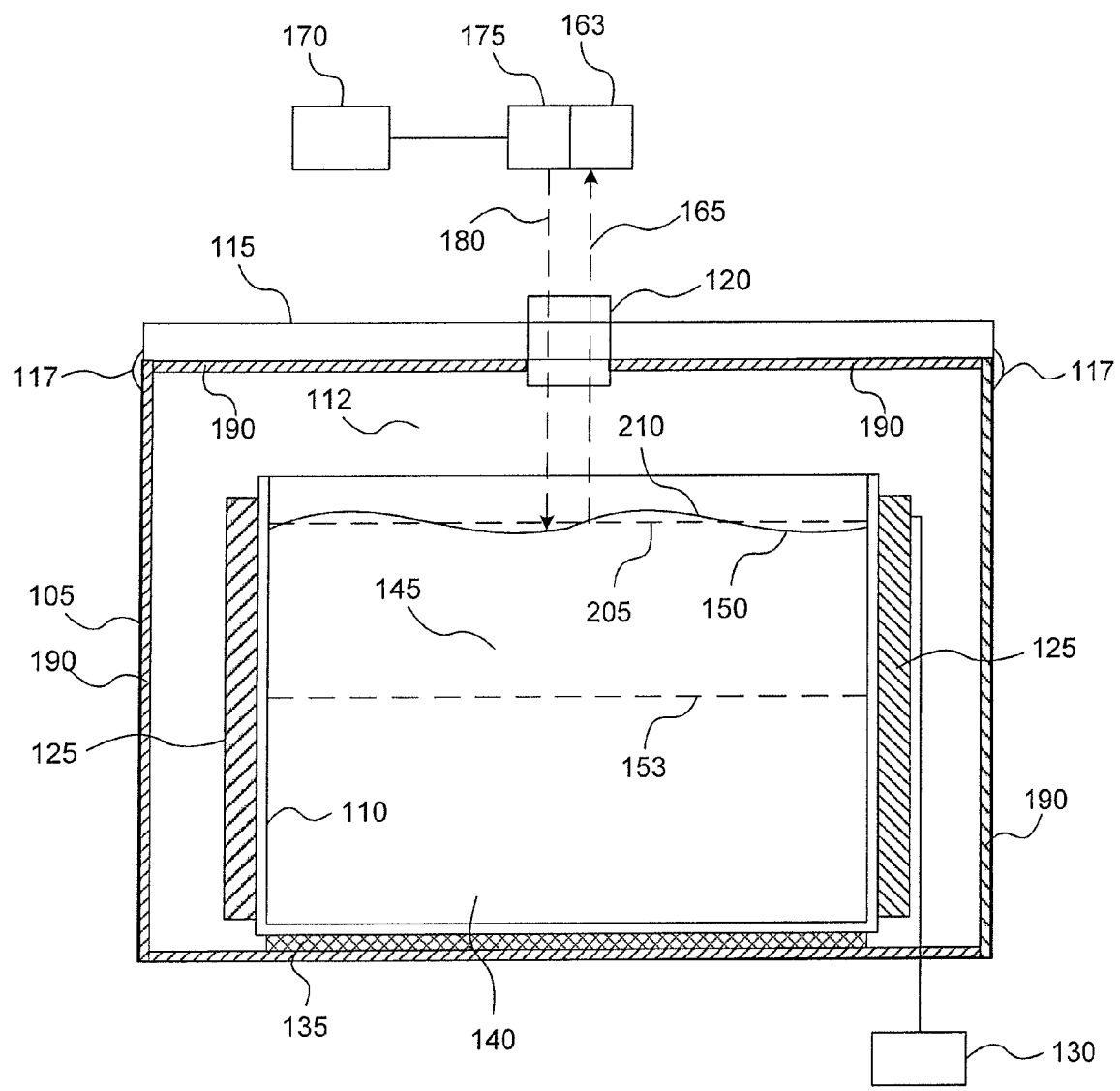
FIG. 2A illustrates, in cross-section, the presence of one or more surface waves in an exemplary casting station and exemplary apparatus for monitoring a solid-liquid interface in a partially-melted material, according to an embodiment of the present invention.
Figure 2B:
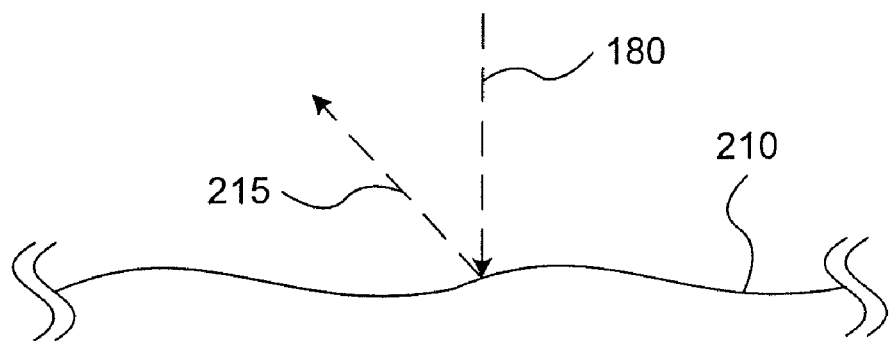
FIG. 2B illustrates, in cross-section, an exemplary surface wave and the resulting reflection of an incident beam of radiation from that surface wave, according to an embodiment of the present invention.

Referring to FIG. 2A, dashed line 205 represents a completely, or substantially completely, flat liquid surface of liquid material 145. Surface perturbations 210 may occur naturally, or may be induced, in liquid material 145, which will ultimately affect the intensity of reflected radiation 165. This is illustrated in FIG. 2B, whereby dashed line 215 represents a reflected portion of transmitted radiation 180 off of the surface perturbations 210 on the surface of liquid material 145. The reflected portion 215 of transmitted radiation 180 may reflect off the surface of liquid material 145 at any angle, depending on the amplitude and frequency of the perturbations 210. When perturbations 210 cause a reflected portion 215 to reflect away from the direction of detector 163, the reflected portion 215 will not be detected by detector 163, as is the case with reflected portion 215 illustrated in FIG. 2B. In FIG. 2B, reflected portion 215 is reflected in a direction that is not perpendicular or substantially perpendicular to window 120, and reflected portion 215 is instead directed away from detector 163. That is, depending on the position of surface perturbations 210, some reflected radiation, such as reflected portion 215, deflected away from window 120 and is not detected by detector 163.

During casting processes, such as those occurring in crucible 110 as shown, for example, in FIG. 1A, distance 155 will be effectively zero when crucible 110 is filled with solid material 140 prior to casting. As solid material 140 is melted during casting, preferably from the top down, liquid surface 150 will form, and liquid material 145 will begin to occupy the upper regions of crucible 110, and solid-liquid interface 153 will be present at the interface between liquid material 145 and the remaining portion of solid material 140. As melting continues, distance 155 will increase until all of solid material 140 is melted. When the cooling stage of the casting process commences, heat will be drawn away from crucible 110 by heat sink 135. Thus, solidification of liquid material 145 will begin, and distance 155 will decrease until all of liquid material 145 is solidified. Distance 155 will once again be effectively zero when the casting process is completed.

Perturbations 210 may be, for example, surface waves on the surface of liquid material 145, waves induced by internal convection occurring during the heating of liquid material 145, or movement generated by electromagnetic stirring caused by current in heater 125 inducing a negative current in liquid material 145 and causing repulsion. Other examples of perturbations 210 include surface waves caused by vibrations occurring in the environment outside of vessel 105, crucible 110, or casting station 100. Such vibrations may be transmitted to liquid material 145 through the walls of vessel 105, crucible 110, or casting station 100. Artificial perturbations may also be introduced into liquid material 145 intentionally during processing. Examples of artificial perturbations include vibrations and displacements as well as sonic waves, such as those produced from a speaker, laser, motor, transducer, or other sonic wave producing device. Natural and artificial perturbations are exemplary perturbations, and other examples of suitable perturbations consistent with the present invention may also be provided during casting.

Figure 2C:
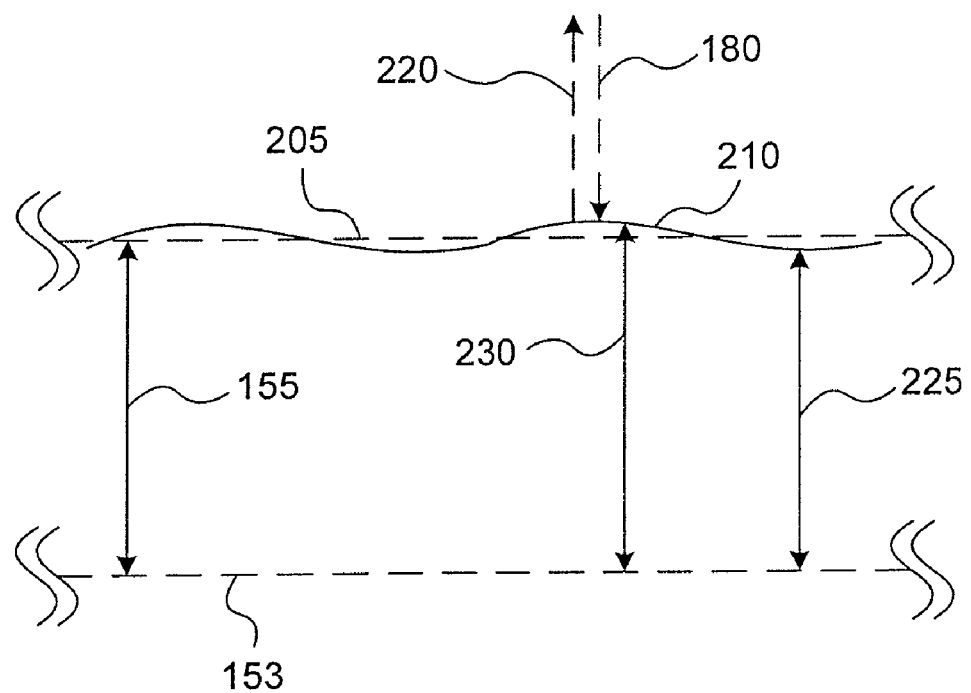
FIG. 2C illustrates, in cross-section, an exemplary method for measuring the distance between a surface wave and a solid-liquid interface, according to an embodiment of the present invention.

Referring to FIG. 2C, a portion of transmitted radiation 180 that is incident upon perturbation 210 may be reflected back towards window 120 and detector 163. Reflected portion 220 of transmitted radiation 180 may thus be directed opposite the direction of transmitted radiation 180. The reflected portion 220 may then be detected by detector 163, as shown, for example, in FIG. 2C. That is, depending on the position of surface perturbations 210, some reflected radiation, such as reflected portion 220, may be reflected back toward window 120 and be detected by detector 163. This will typically occur when transmitted radiation 180 is incident on a maxima or minima of surface perturbations 210, or when the deflection is sufficiently small to allow collection at the emitter. The incident and reflected beams can also be optically manipulated to obtain signal from a broader range of reflection angles, for example with lenses and mirrors.

Still referring to FIG. 2C, distance 155 between liquid surface 150 and solid-liquid interface 153 is shown, as in FIG. 1A, in the case when there are no surface perturbations on liquid surface 150. When surface perturbations 210 exist on liquid surface 150, the distance between the liquid surface 150 and solid-liquid interface 153 will vary, depending on the amplitude and frequency of surface perturbations 210. Depending on the position of surface perturbations 210 under window 120, the distance between the liquid surface 150 and solid-liquid interface 153 may be less than distance 155, as depicted by arrow 225, showing the distance from a minima in surface perturbations 210 and the solid-liquid interface 153. On the other hand, the distance between the liquid surface 150 and solid-liquid interface 153 may be greater than distance 155, as depicted by arrow 230, showing the distance from a maxima in surface perturbations 210 and the solid-liquid interface 153.

The surface area of liquid material 145 inside crucible 110 is substantially constant during casting, excluding thermal expansion, but the wave velocity of surface perturbations 210 changes as a function of the thickness of liquid 145. Thus, during casting, the frequency of surface perturbations 210 can be calculated at different times during the casting process. That is, because the surface area of liquid material 145 inside crucible 110 is known, and the frequency of surface perturbations 210 can be measured, the wave velocity can be calculated, and, in turn, the distance 155 between liquid surface 150 and solid-liquid interface 153 can be determined.

This in turn will correspond to a change in the amount and intensity of reflected radiation 165 or 220 detected by detector 163. Because distance 155 will vary during the casting process (increasing during melting, and decreasing during solidification), the resultant frequencies of surface perturbations 210 will change as the thickness of liquid material increases (during melting) and decreases (during solidification).

Surface perturbations 210 may be of two distinct forms. The first kind of perturbations is due to the transmission of sound waves in the bulk of liquid material 145 manifested on the liquid surface. These perturbations involve the motion not of large quantities of matter, but of small atomic displacements in the form of sonic energy. The characteristic frequencies of the second kind of perturbations will be in a range above about 100 Hz and may have a small amplitude at the surface (i.e., less than 1 mm), typically involving atomic oscillations on the sub-millimeter scale. The second kind of perturbation is mass transport waves that will move back and forth across the surface at relatively low frequencies (i.e., less than 50 Hz). For example, these waves may be caused by ambient vibrations transmitted through crucible 110 in any direction. The amplitude of these waves may be greater than about 1 mm, involving atoms typically moving over millimeter to centimeter order distances.

Figure 3:
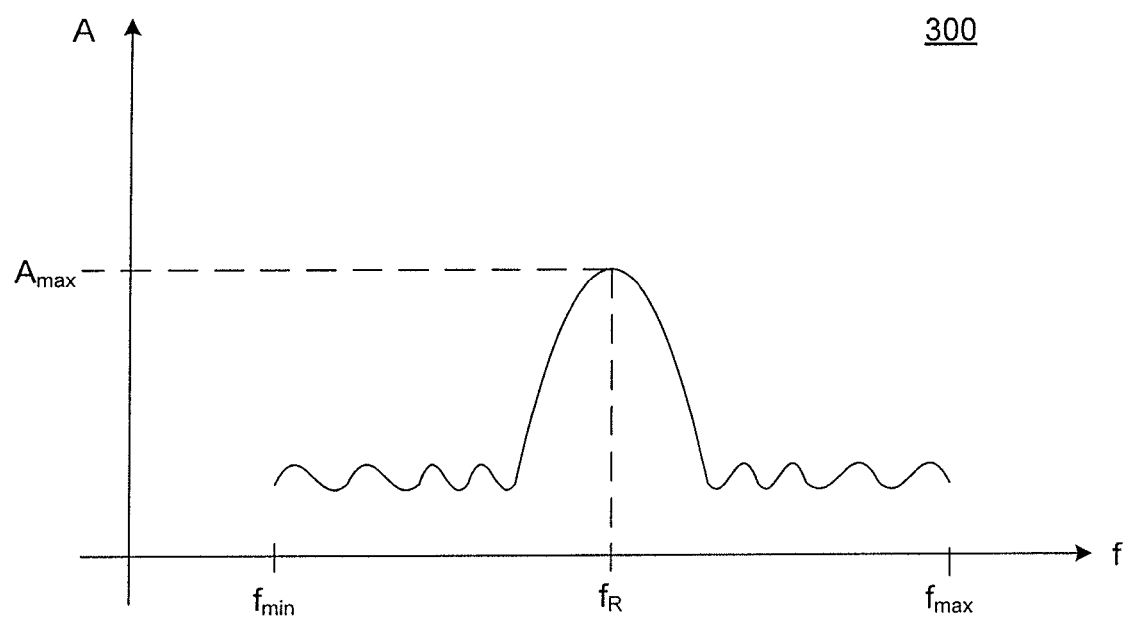
FIG. 3 is a graphical representation of an exemplary method for determining a resonance frequency corresponding to a distance between a surface wave and a solid-liquid interface, according to an embodiment of the present invention.

Consistent with embodiments of the invention, the resonance frequency of surface perturbations 210 may be calculated using a Fourier transform method on the periodic amplitude or intensity variation of emitted or reflected radiation 160 corresponding to surface perturbations or sound waves 210. Referring to FIG. 3, for example, a Fourier transform 300 is depicted for time ($t_0$) to time ($t_f$). That is, Fourier transform 300 can be calculated on the signal acquired from $t_0$ through $t_f$. Calculation of the Fourier transform 300 may be performed by calculation and storage device 170, based on data obtained by detector 163. Thus, between time $t_0$ and $t_f$, the intensity of reflected radiation detected by detector 163 is analyzed using the Fourier transform method to determine the frequency components of the signal.

Still referring to FIG. 3, a maximum amplitude ($A_{max}$) exists at a corresponding resonance frequency ($f_R$), which in turn corresponds to the thickness of the liquid material at a given time during casting. That is, $f_R$ corresponds to the distance 155 between solid-liquid interface 153 and liquid surface 150 at a given time. $f_R$ occurs between the minimum frequency ($f_{min}$), which corresponds to the maximum thickness of liquid material 145 (for example, distance 230 shown in FIG. 2C), and the maximum frequency ($f_{max}$), which correspond to the minimum thickness of liquid material 145 (for example, distance 225 shown in FIG. 2C), respectively.

A resonance frequency ($f_R$) can be artificially stimulated in liquid material 145. In each of the three cases shown in FIGS. 4-6, for example, the location of solid-liquid interface 153 can therefore be determined by introducing a sonic wave, such as a continuous sonic wave to the liquid surface 150. Alternatively, disturbances may be induced by producing vibrations in or beneath the liquid surface 150. In each case (FIGS. 4A, 5, and 6), these sonic waves are partially absorbed at the liquid surface 150 and the absorbed sonic wave is transmitted down to solid/liquid interface 153. At this point, a portion of the sonic wave will reflect back up to the surface. At the fundamental resonance frequency of the liquid material 145, the reflected sonic wave will constructively interfere with the next wave front of the sonic wave coming from the sound generator to the liquid surface 150. By scanning through a range of frequencies of applied sonic waves, the $f_R$ can be found, for example, by measuring the liquid response and tracking the magnitude of the induced peak of Fourier transform 300. The height of the induced frequency in Fourier transform 300 will have a maximum at $f_R$. Because Fourier transform 300 is essentially a conversion of a time-based signal to a frequency-based signal, it can be calculated using techniques known to those of ordinary skill in the art.

Referring to FIGS. 4A-B, 5, and 6, other embodiments consistent with the invention are shown, in which the liquid surface 150 is stimulated to produce a plurality of sonic waves, either over time in a sweep, or simultaneously. By producing a plurality of sonic waves at different times during the casting process, the resonance frequency ($f_R$) can be found as it changes with the thickness of liquid material 145 inside crucible 110, for example, during solidification.

Figure 4A:
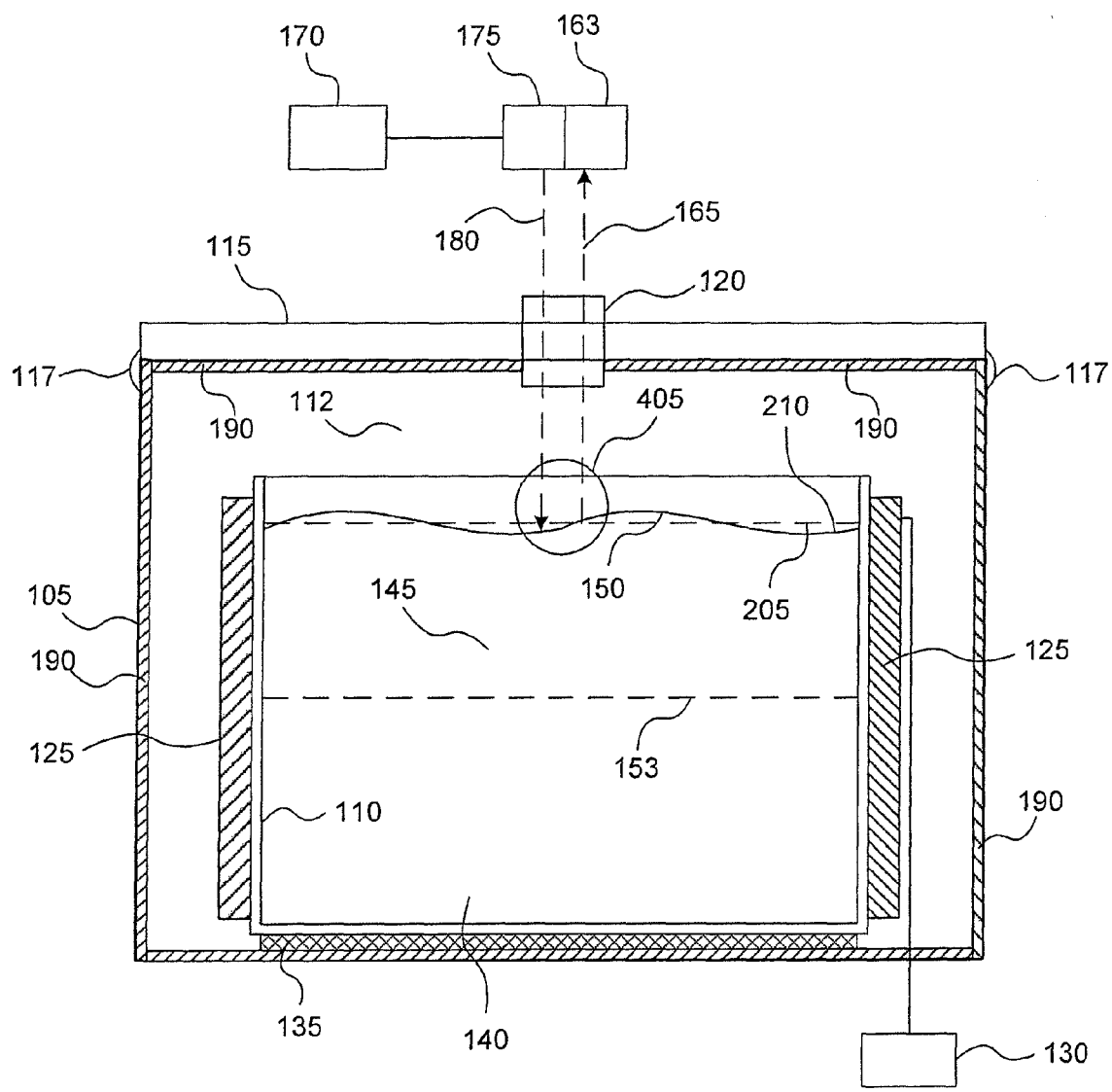
FIG. 4A illustrates, in cross-section, an exemplary casting station and apparatus for monitoring a solid-liquid interface in a partially-melted material by using a beam of radiation to induce a shock wave, according to an embodiment of the present invention.
Figure 4B:
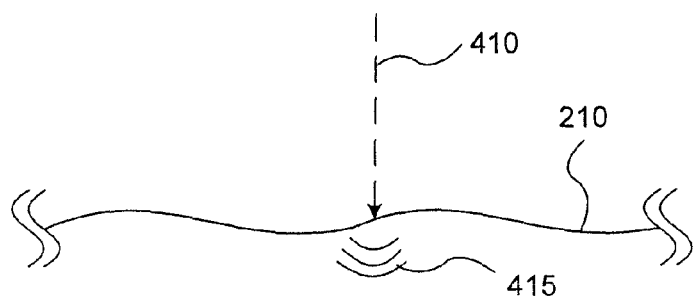
FIG. 4B illustrates a closer view of the shock wave induced according to FIG. 4A.

Referring to FIGS. 4A and 4B, emitter 175 is used to generate pulsed electromagnetic radiation 180, with sufficient energy density to produce a sonic shock wave pulse in liquid surface 150. FIG. 4B is an expanded view of the region 405 in FIG. 4A, and illustrates laser radiation 410 emitted, for example, from emitter 175. In order to be effective in producing the sonic shock wave pulse, the absorbed power density of the laser radiation 410 needs to be substantial enough to cause ablation of a portion of the liquid material 145 or to generate a thermal impulse to create a pressure wave (due to typically supersonic thermal expansion of a portion of liquid material 145 or a vaporized portion of material (not shown)). Ablation may occur when laser radiation 410 is so strongly absorbed as to turn a portion of the volume of liquid material 145 into a plasma, the rapid expansion of which exceeds the speed of sound and creates shock waves 415 in the surrounding portions of liquid material 145. For example, many types of lasers can be used to achieve the necessary power to cause ablation of a portion of liquid material 145, though the laser radiation 410 should be focused/collimated on a sufficiently small portion of liquid material 145 to achieve the necessary aerial power density. Laser radiation 410 thus induces shock waves 415 on liquid surface 150 and in liquid material 145. Shock waves 415 in turn produce negligible mass transport surface perturbations 210 on liquid surface 150. Shock waves 415 may be used, for example, to transmit sound pulses to solid/liquid interface 153. The frequency of the overall sonic excitation will be determined by the repetition rate of the laser pulses. At the frequency where the next incoming laser pulse constructively interferes with the reflected sonic wave front of the current pulse, the fundamental resonance frequency ($f_R$) will be measured, and the position of solid-liquid interface 153 can then be calculated in the manner described below. Other higher order resonances may also be observed at higher frequencies, as well as frequencies of destructive interference, all of which correlate to the same height information of the liquid.

Figure 5:
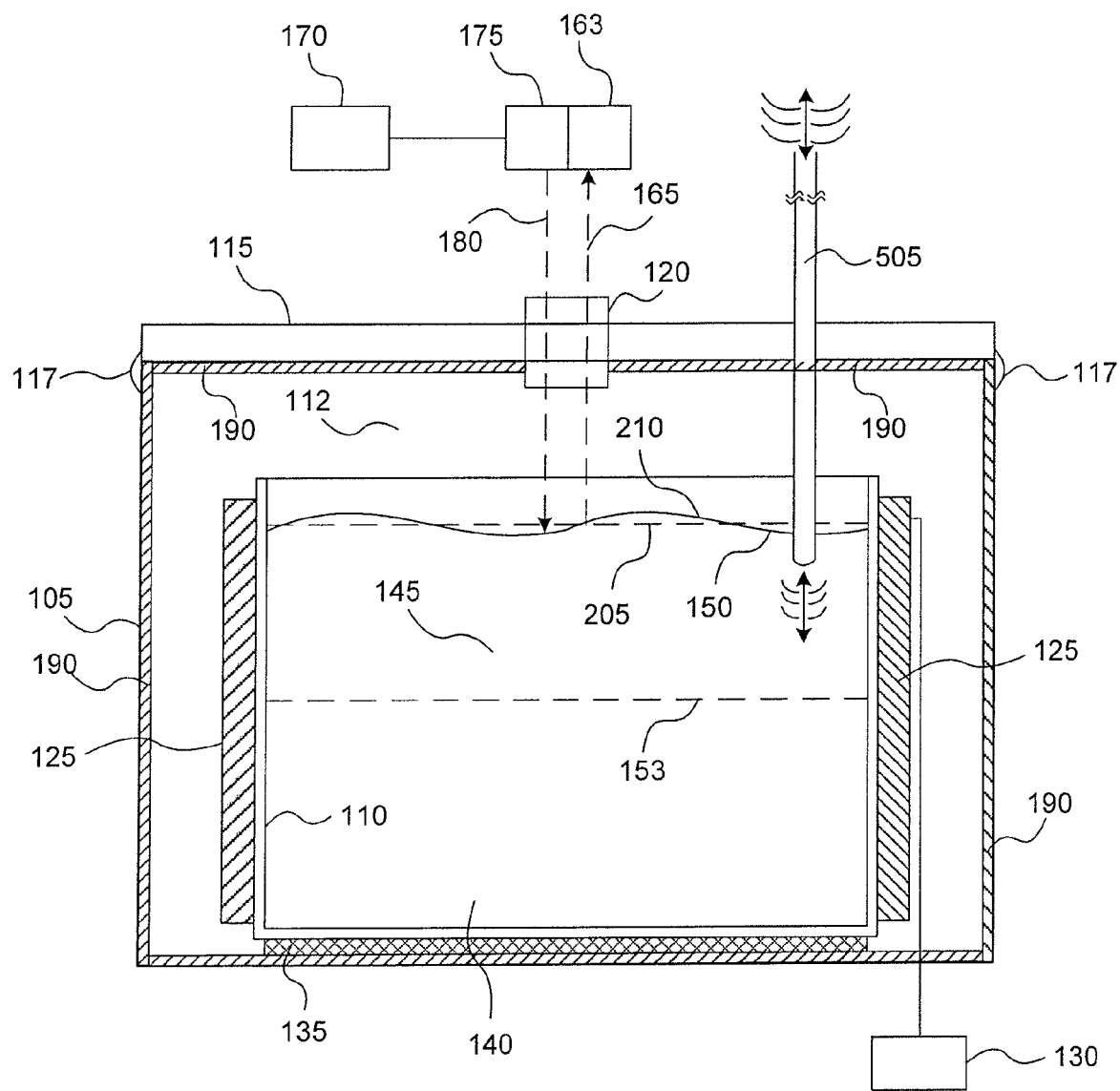
FIG. 5 illustrates, in cross-section, an exemplary casting station and apparatus for monitoring a solid-liquid interface in a partially-melted material by using a rod to transduce a sonic wave, according to an embodiment of the present invention.

Referring to FIG. 5, a moveable rod 505 is used to transmit sound waves 210 into liquid material 145. Rod 505 may be, for example, silicon carbide, or any other suitable material that will withstand the heat and duration of the casting process without itself melting or otherwise reacting with or contaminating liquid material 145 with impurities. Other materials, such as silicon nitride, quartz, and aluminum oxide may also be used for moveable rod 505. The frequency of the sound waves can then be varied over a range to determine the resonance frequency as described above and depicted in FIG. 3. Rod 505 could also be used, for example, to generate perturbations 210 by moving up and down in liquid material 145, when ambient vibrations are not significant, or are not consistent enough to produce sizeable surface waves on liquid surface 150. The use of rod 505 is different from known dip-rod methods, for example, in that rod 505 does not penetrate liquid material 145 to the point of contacting solid-liquid interface 153. The resonance frequency ($f_R$) of surface perturbations 210, and the position of solid-liquid interface 153, can then be calculated in the manner described above.

Whatever excitation method is used to produce surface perturbations 210, however, the frequency of the excitation may be controlled by an external source. In an embodiment consistent with the invention, the repetition rate of a laser may be controlled by a computer program for generating a frequency sweep in a given time. In another embodiment consistent with the invention, a signal generator may be used through an amplifier to drive a speaker in a selected frequency range, producing either sweeps or white noise. Therefore, consistent with embodiments of the invention, any method of generating an analog voltage signal or a digital signal with a given frequency or set of frequencies may be used. Liquid material 140 may be probed by changing the excitation frequency and monitoring the vibrations on the surface of liquid material 140. This monitoring can be done, for example, with a laser vibrometer, to monitor the amplitude of perturbations 210 at the driving frequency. At resonance wavelengths, this amplitude will have a local maxima with a bandwidth of about 20 Hz to about 30 MHz, depending on the melt depth, the speed of sound in the medium, and the order of the harmonic. For example, near the end of the melting phase and at the beginning of the solidification phase in a casting cycle of silicon, the resonance frequency ($f_R$) will generally be in the range between about 2 KHz and about 10 KHz. Thus, consistent with an embodiment of the invention, and for liquids in an open vessel or crucible, amplitude maxima will occur at wavelengths (l) (known from Fourier transform 300), related to the height of liquid material 145 (represented by arrow 155 in FIG. 1A, for example) by the equation:

$$l = \frac{4L}{(2m-1)},$$

where l is the wavelength where the disturbance has an amplitude maxima, L is the thickness, and m is a positive integer (1, 2, 3, . . . ). Consequently, the thickness of the liquid can be calculated directly from the frequency of the observed maximum with the following relation:

$$L = \frac{(2m-1)v_s}{4f}.$$

It is generally convenient to use the fundamental frequency where m=1, since this should be the minimum resonance frequency possible. Thus, the thickness (L) of liquid material 145, and, consequently, the location of solid-liquid interface 153, may be determined. In addition, other empirical relations may be found with resonant or dead frequencies that occur with characteristic relations to the height of the liquid material.

Another way to measure the progress of solidification by knowing the position of a submerged solid-liquid interface 153 involves introducing discrete pulses into liquid surface 150 and watching for the reflection of the pulse from the solid-liquid interface 153. Conventionally, this has been accomplished using ultrasonic transducers and sensors, which require some level of contact with the medium being cast. Consistent with the present invention, however, this level of contact is unnecessary when a high power laser or remote speaker system is used to produce discrete sonic pulses on liquid surface 150. A remote measurement device, for example a laser vibrometer, can be used to measure both the initial and reflected pulses. By measuring the time difference, dt, between the initial and reflected pulses and knowing the speed of sound, $v_s$, in the medium, it is possible to directly measure the depth of the liquid. It is similarly possible to measure the height dimension of a solid object. The depth of the liquid, $l_d$, will be given by $$l_d = v_s * \frac{dt}{2}.$$

Pulses may be generated on the liquid surface in one of two ways.

In the first way, consistent with the present invention, a high power laser beam is tuned to have a minimum possible beam size at the level of the liquid surface, either by collimating the beam or by using focusing optics. The laser may then generate individual pulses, or it may generate a steady train of pulses at an inter-pulse period that is preferably at least twice the length of the expected reflection time. Consistent with the present invention, this method is applicable even under vacuum conditions.

A second way, consistent with the present invention, involves using a speaker to create individual pulses or a continuous train of pulses at a given frequency in conjunction with an ambient atmosphere capable of transmitting the sonic energy to the liquid surface. By way of example, the speed of sound in liquid silicon is 3920 m/s, so it will take only 0.11 ms to reflect off the bottom surface of crucible 110 when the material is fully melted at 22 cm height. With only 2 cm liquid height remaining, the time between initial and reflected pulses will be 0.005 ms, which defines the frequency response necessary in detector 163 (greater than 1 MHz for sufficient resolution in this example), as well as the pulse width of the pulses (shorter than 0.002 ms).

Consistent with the present invention, a second type of perturbations, such as waves caused by ambient vibrations transmitted through crucible 110 in any direction (discussed earlier), may include mass transport waves that will move back and forth across the surface at relatively low frequencies (i.e., less than about 500 Hz). The speed, $v_{SW}$, of a surface wave in a shallow liquid may be calculated by the equation $v_{SW} = (gL)^{1/2}$, where g is the gravitational constant and L is the depth of the liquid. Generally, a single wave front propagating in the crucible will reflect back and forth several times before eventually damping out. Assuming primary propagation perpendicular to a crucible wall (when using, for example, a rectangular crucible), the observed frequency will depend on the speed of the wave packet and the width of the crucible in the direction of propagation, w. The frequency, f as observed in the middle of the crucible will be determined by the following relation:

$$f = \frac{v_{SW}}{w} = \frac{(gL)^{\frac{1}{2}}}{w}.$$

Alternately, the depth of the liquid, L, can be determined by the measured frequency according to:

$$L = \frac{f^2 w^2}{g}.$$

This observed frequency is independent of the driving frequency creating the wave front and depends only on the width of the crucible and depth of the liquid.

For example, a crucible with a width of 69 cm and a liquid depth of 22 cm will have a primary surface wave frequency of 2.13 Hz. Similarly, for example, a crucible with only 2 cm of liquid will have a frequency of 0.64 Hz, thus necessitating precise measurement of low frequency waves. Therefore, consistent with the present invention, the above-described methods can rely on ambient vibrations for the production of surface perturbations, or, alternatively, a purpose-built system can be used to produce perturbations on demand for particularly quiet environments. The overall liquid depth of solid/liquid interface 153 can therefore be calculated by measuring either the frequencies of surface waves or by measuring the wave speed directly using a laser-reflection method.

Figure 6:
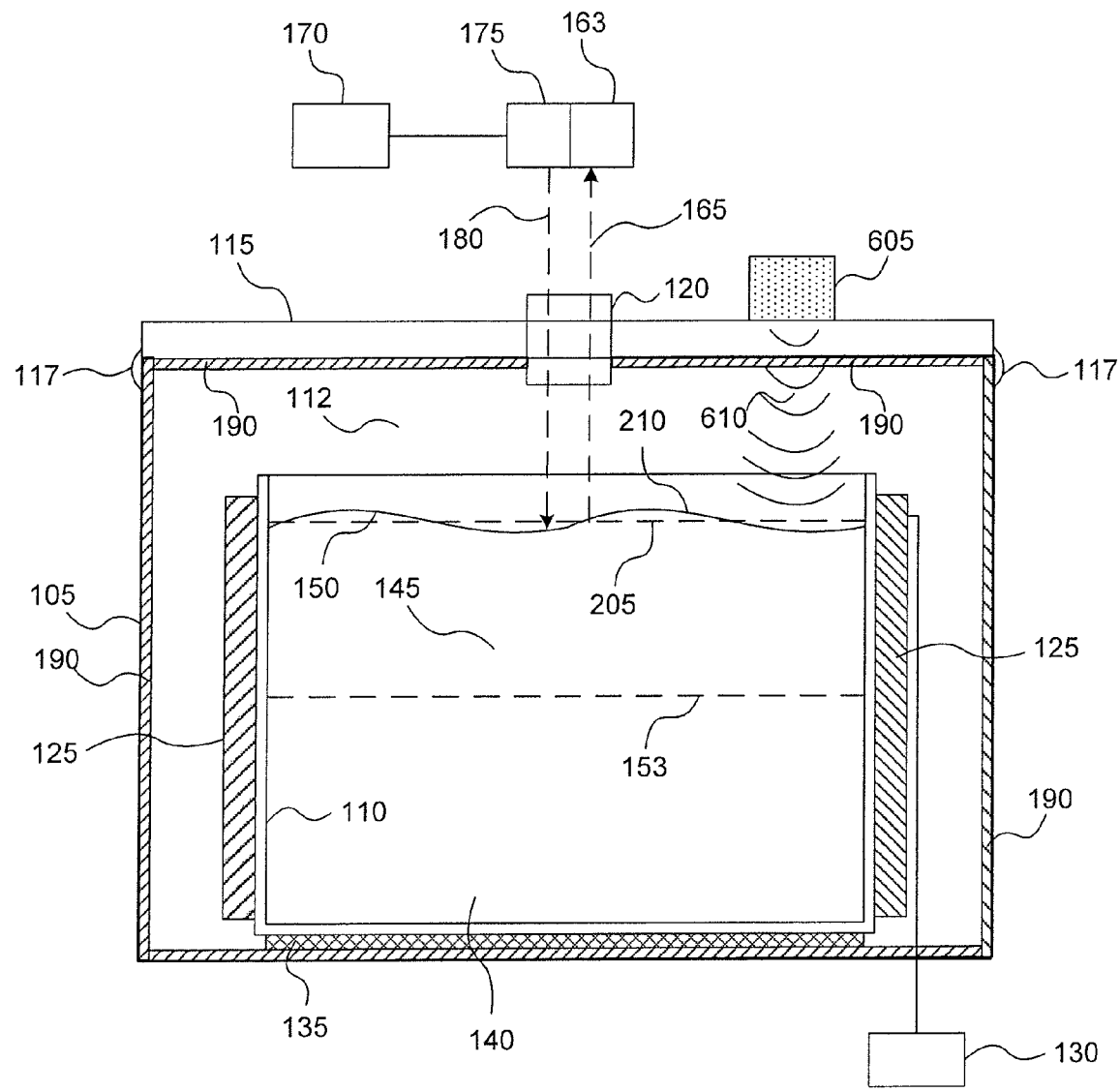
FIG. 6 illustrates, in cross-section, an exemplary casting station and apparatus for monitoring a solid-liquid interface in a partially-melted material by inducing a surface wave, according to an embodiment of the present invention.

Referring to FIG. 6, a wave generator 605 is used to generate waves 610 (e.g., bulk, mass transport waves) on liquid surface 150 to produce surface perturbations 210. Wave generator 605 may be used, for example, to generate waves 610 when ambient vibrations are not significant, or are not consistent enough to produce standing waves on liquid surface 150. The power of such a device (i.e., wave generator 605) need only be sufficient to transmit all the way to the liquid at the low frequencies needed to create surface waves. Conventional audio speakers can be used as wave generator 605, as can physical vibration drivers like motors, piezo devices, or vibrating devices, such as a linear or rotary ball knocker. The resonance frequency of surface perturbations 210 can then be calculated in the manner described for surface waves above. Alternately, a higher frequency method of generating waves 610 from wave generator 605 can be employed where audio signals are coupled to liquid surface 150. The resonance of liquid material 145 can be determined by measuring sonic vibrations at liquid surface 150.

Figure 7:
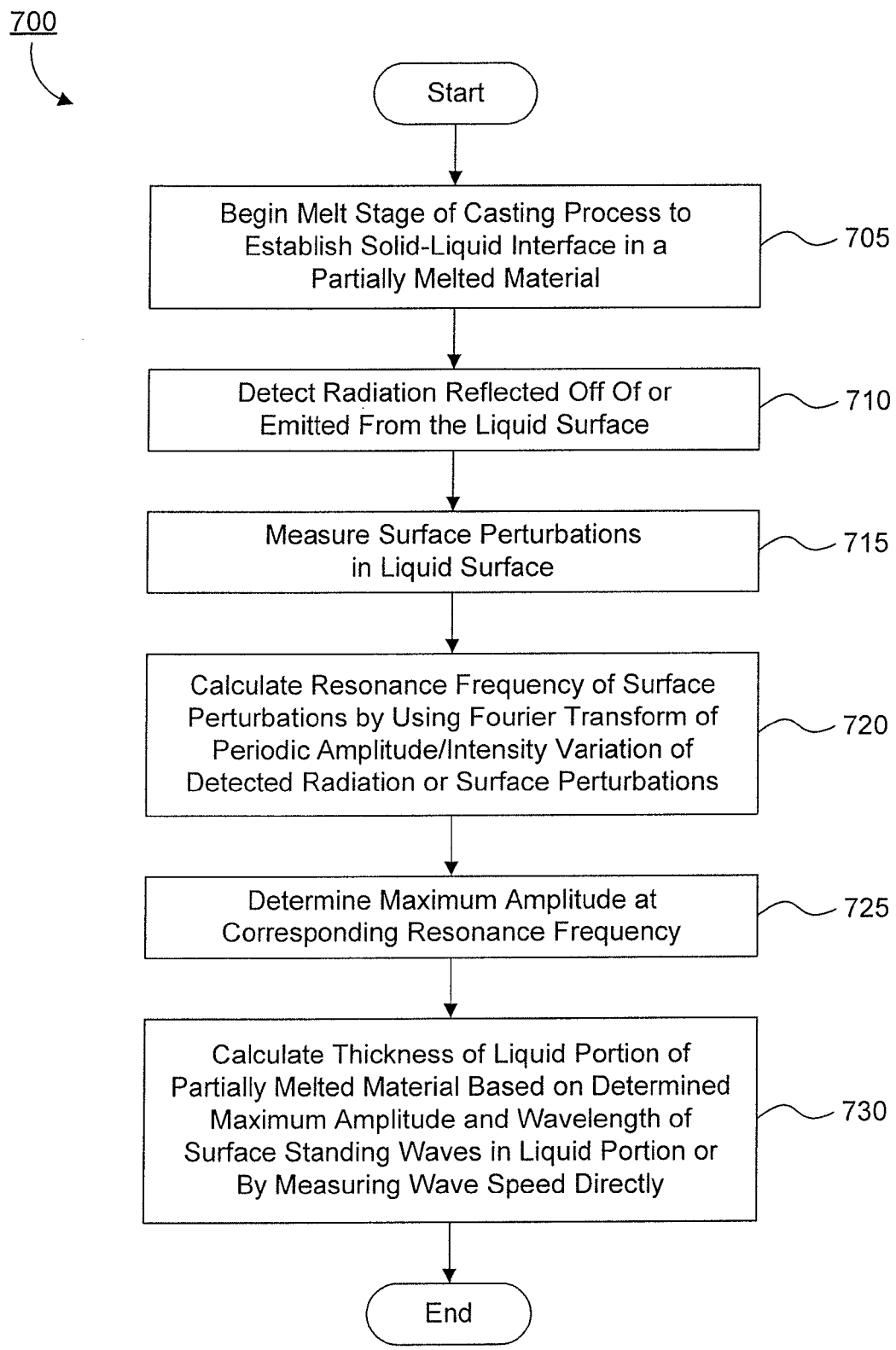
FIG. 7 illustrates an exemplary method according to an embodiment of the present invention.

FIG. 7 is a flowchart depicting an exemplary method of monitoring a solid-liquid interface, consistent with the present invention. Consistent with FIG. 7, method 700 may begin by beginning the melt stage of a casting process to establish a solid-liquid interface in a partially or fully melted material (step 705). Next, radiation is detected by either reflections off of, or emissions from, the liquid surface (step 710). Surface perturbations are then measured in the liquid surface (being due to native background vibrations or induced vibrations; see step 715). The resonance frequency of surface perturbations is then calculated using a Fourier transform of the periodic amplitude/intensity variation of the detected radiation or surface perturbations (step 720). The maximum amplitude is determined at a corresponding resonance frequency (step 725). Then, the thickness of the liquid portion of the partially melted material is calculated based on the determined maximum amplitude and wavelength of surface standing waves in the liquid portion or by measuring the wave speed directly (step 730).

It will be apparent to those skilled in the art that various modifications and variations can be made in the disclosed structures and methods without departing from the scope or spirit of the invention. Although casting of silicon has been primarily described herein, other semiconductor materials and nonmetallic crystalline materials may be cast without departing from the scope and spirit of the invention. For example, casting of other materials is possible, such as gallium arsenide, silicon germanium, aluminum oxide, gallium nitride, zinc oxide, zinc sulfide, gallium indium arsenide, indium antimonide, germanium, yttrium barium oxides, lanthanide oxides, magnesium oxide, and other semiconductors, oxides, and intermetallics with a liquid phase. It will now be apparent to one of ordinary skill in the art that a solid-liquid interface of any material including any metal or semimetal which can withstand the temperatures required for casting without sublimating could be characterized by the above described methods and systems. These metals and semimetals may include, for example, B, C, N, O, Al, Si, P, S, Zn, Ga, Ge, As, Se, Cd, In, Sn, Sb, Te, Hg, Pb, and Bi. Other embodiments of the invention will be apparent to those skilled in the art from consideration of the specification and practice of the invention disclosed herein. It is intended that the specification and examples be considered exemplary only, with a true scope and spirit of the invention being indicated by the following claims.

What is claimed is:

1. A method of monitoring a solid-liquid interface, comprising:
    providing a vessel configured to contain an at least partially melted material;
    detecting radiation reflected from a surface of a liquid portion of the at least partially melted material that is parallel with the liquid surface;
    measuring a disturbance on the surface;
    calculating at least one frequency associated with the disturbance; and
    determining a thickness (L) of the liquid portion based on $$L = \frac{f^2 w^2}{g},$$

where g is the gravitational constant, w is the horizontal width of the liquid, and f is the at least one frequency.

2. The method according to claim 1, where the disturbance is measured by a laser, pyrometer, CCD camera, or other light detecting device.

3. The method according to claim 1, wherein the radiation is at least one of a laser light, ambient light, and native radiation emitted from the surface.

4. The method according to claim 1, wherein the disturbance is detected by monitoring vibrations on the surface of the liquid portion.

5. The method according to claim 1, wherein the disturbance is induced by projecting sound waves into, or inducing sound pulses in, the surface.

6. The method according to claim 5, wherein the sound waves are produced by a speaker, laser, motor, transducer, or other sonic vibration producing device.

7. The method according to claim 1, wherein the at least partially melted material includes at least one element from the transition metals or groups III-A, IV-A, V-A, and VI-A of the periodic table.

8. A method of monitoring a solid-liquid interface, comprising:
    providing a vessel configured to contain an at least partially melted material, the at least partially melted material being at least partially reflective;
    detecting radiation reflected from a surface of a liquid portion of the at least partially melted material that is parallel with the liquid surface;
    measuring a size of a reflection of an object from a viewpoint above the surface;
    calculating a distance to the surface from the viewpoint; and
    calculating a thickness of the liquid based on the distance.

9. The method according to claim 8, wherein the size is measured based on a ratio of dark vs. light area viewed at the viewpoint in a field of view of predetermined diameter.

10. The method according to claim 8, wherein the radiation is at least one of a laser light, ambient light, and native radiation emitted from the surface.

11. The method according to claim 8, wherein a change in reflected radiation is due to perturbations having one or more frequencies above about 100 Hz and amplitude less than about 1 mm.

12. The method according to claim 8, wherein the at least partially melted material includes at least one element from the transition metals or groups III-A, IV-A, V-A, and VI-A of the periodic table.

13. The method according to claim 1, wherein the monitoring occurs during casting silicon.

14. The method according to claim 1, wherein the monitoring occurs during crystallization upwards away from seeds.

* * * * *